United States Patent [19]

Aoki et al.

[11] Patent Number: 5,438,953
[45] Date of Patent: Aug. 8, 1995

[54] CRYSTAL GROWTH APPARATUS

[75] Inventors: Yoshihira Aoki, Tochigi; Hisashi Yamaguchi; Giyuu Kido, both of Miyagi, all of Japan

[73] Assignee: Mitsui Mining & Smelting Co., Ltd., Tokyo, Japan

[21] Appl. No.: 34,481

[22] Filed: Mar. 19, 1993

[30] Foreign Application Priority Data

Mar. 19, 1992 [JP] Japan .................................. 4-092397

[51] Int. Cl.[6] .................. C30B 11/02; C30B 35/00
[52] U.S. Cl. ..................................................... 117/223
[58] Field of Search ............. 156/616.1, 616.4, 616.41, 156/620.7, DIG. 89; 422/245, 248

[56] References Cited

U.S. PATENT DOCUMENTS

| | | | |
|---|---|---|---|
| 3,642,443 | 2/1972 | Blum et al. | 422/245 |
| 4,545,848 | 10/1985 | Lehoczky et al. | 156/616.4 |
| 4,957,711 | 9/1990 | Min et al. | 156/616.1 |
| 5,037,621 | 8/1991 | Kennedy et al. | 156/616.1 |
| 5,135,726 | 8/1992 | Min et al. | 422/245 |
| 5,248,483 | 9/1993 | Carter | 422/245 |

OTHER PUBLICATIONS

"Directional Solidification of Aluminum–Silicon Eutectic Alloy in a Magnetic Field," *Journal of Crystal Growth*, Y. Aoki et al, vol. 62, No. 1, (Jun. 1983), pp. 207–209.

*Primary Examiner*—R. Bruce Breneman
*Assistant Examiner*—Felisa Garrett
*Attorney, Agent, or Firm*—Sughrue, Mion, Zinn, Macpeak & Seas

[57] ABSTRACT

A crystal growth apparatus is herein disclosed, which comprises a vertical magnetic field-generating apparatus for establishing a cylindrical, vertical magnetic field space; a vertical Bridgman furnace arranged within the space; a base plate positioned above the magnetic field-generating apparatus; a heat-generating furnace comprising a water jacket, a quartz tube and a heating element; a combustion tube for accommodating a crucible at a predetermined position; a means for vertically suspending and supporting the combustion tube; a means for guiding the suspending means to move it up and down; and a means for driving the suspending means in the upward and downward directions such that the combustion tube is lowered and risen in the heat-generating furnace; the guide means and the driving means being fitted to the base plate; the heat-generating furnace being arranged at a predetermined position within the space and fitted to the base plate through a supporting member; and a motor of the driving means being placed at a position wherein the motor is not greatly affected by a magnetic field established by the magnetic field-generating apparatus.

1 Claim, 5 Drawing Sheets

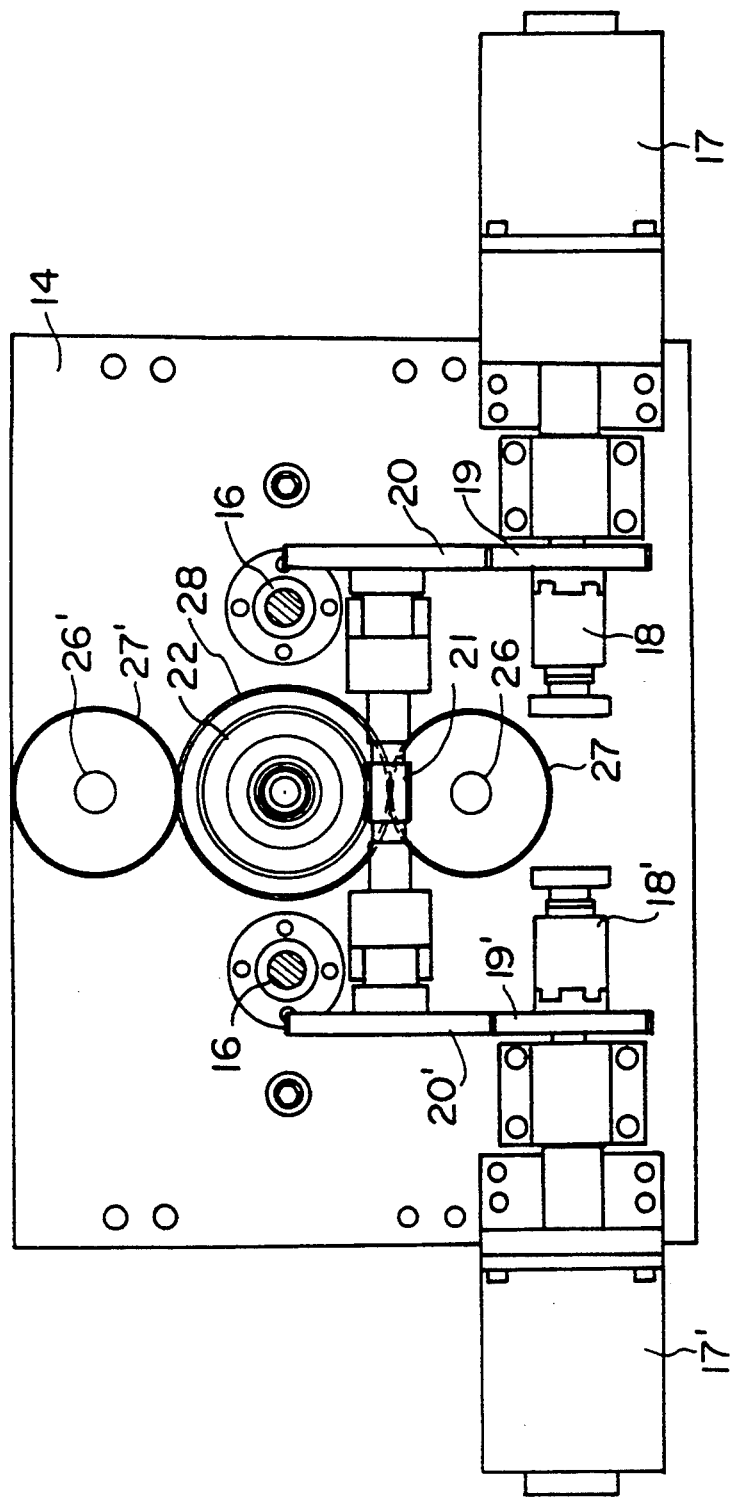

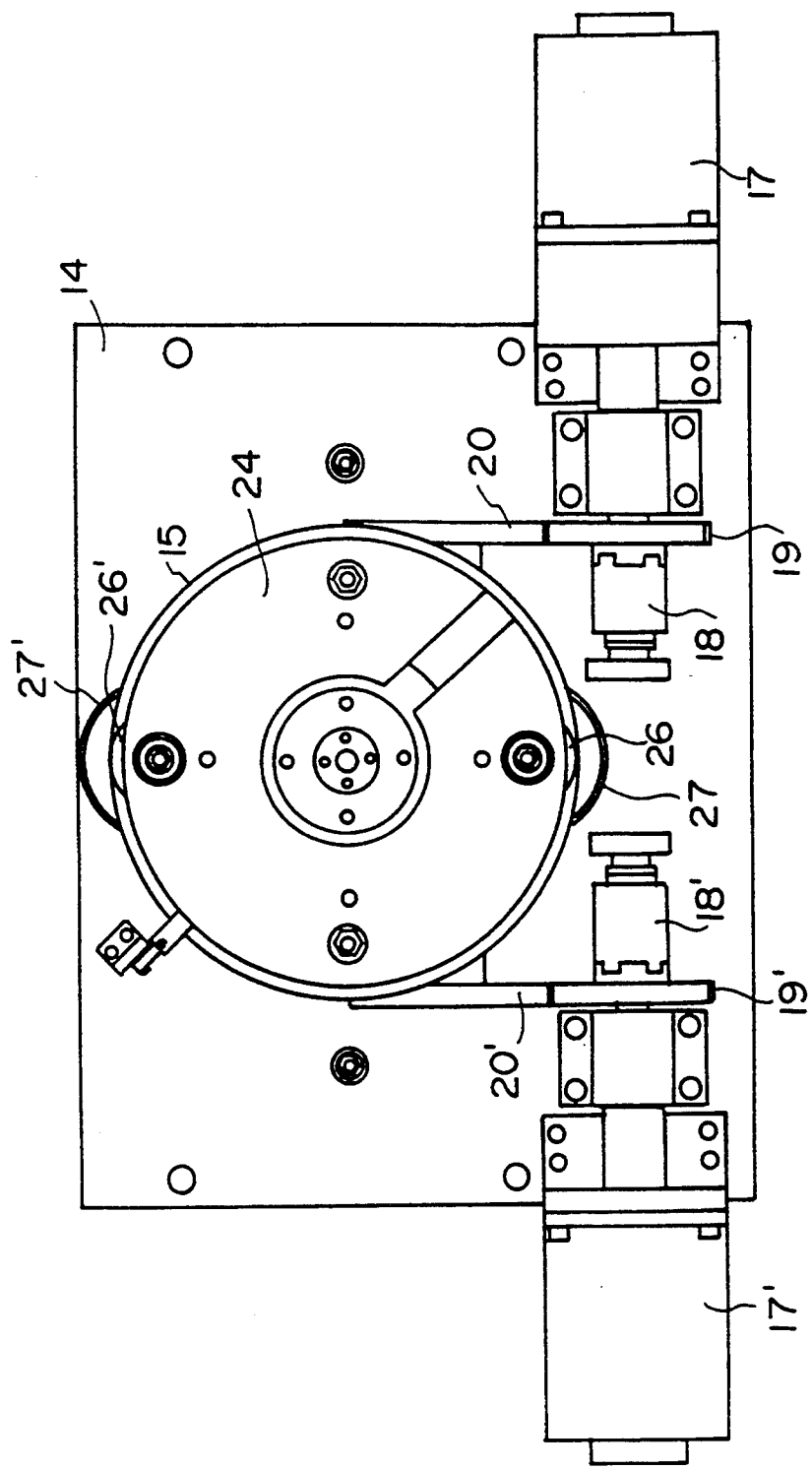

CRYSTAL GROWTH APPARATUS

BACKGROUND OF THE INVENTION

1. Field of the Invention

The present invention relates to a crystal growth apparatus and more specifically to a crystal growth apparatus for growing a crystal by unidirectionally solidifying a melt contained in a crucible by using a vertical Bridgman furnace in a cylindrical and vertical magnetic field space.

2. Description of the Prior Art

There has conventionally been used a method for growing a crystal in a crystal growth furnace incorporated into a strong magnetic field-generating apparatus as a means for growing a crystal in a strong magnetic field. However, taking into consideration the magnitude of a magnetic field applied, size of an effective magnetic field space, the kinds of heat sources and the effect of a magnetic field on driving mechanism (motor), the application of the crystal growth furnace is considerably limited. For instance, when making use of a cylindrical narrow vertical magnetic field space, the most suitable crystal growth furnace is a vertical Bridgman furnace because of the shape of the effective magnetic field space and the simplicity of the installation of a crystal growth apparatus and the simplified operations thereof.

Upon assemblage of a crystal growth apparatus wherein a vertical Bridgman furnace is arranged within a cylindrical vertical magnetic field space such as that disclosed in Journal of Crystal Growth, 1983, 62, pp. 207–209, a driving mechanism for rising and lowering a combustion tube which accommodates a crucible at a predetermined position is constructed independently of a heat-generating furnace and the combustion tube and arranged within the space under a vertical magnetic field-generating apparatus (hereinafter referred to as "water-cooled magnet") and in the proximity of the extension of the central axis (hereinafter referred to as "axis of magnetic field") of the cylindrical magnetic field space. On the other hand, the heat-generating furnace and the combustion tube are inserted into and placed in the cylindrical and vertical magnetic field space through the upper part of the water-cooled magnet and the lower end of the combustion tube passes through the water-cooled magnet and fitted to the foregoing driving mechanism within the space under the water-cooled magnet. Such a structure permits the rising and lowering of the combustion tube.

In the conventional crystal growth apparatus having the foregoing structure, the driving mechanism is constructed independently of the heat-generating furnace and the combustion tube as discussed above. Accordingly, the operation for fitting the lower end of the combustion tube to the driving mechanism must accurately be carried out within a relatively narrow space under the water-cooled magnet and the position of the driving mechanism relative to the heat-generating furnace and the combustion tube must be precisely adjusted in such a manner that the central axis of the combustion tube coincides with the axis of the magnetic field, each time the vertical Bridgman furnace is arranged within the cylindrical and vertical magnetic field space. However, it is quite troublesome to accurately arrange and position the combustion tube within such a relatively narrow space under the water-cooled magnet. This impairs the workability and if the alignment of these apparatuses is incomplete, the combustion tube comes in contact with the inner wall of the heat-generating furnace during rising and lowering operations and causes vibrations. This leads to agitation of the melt in the crucible and accordingly interferes with the optimum crystal growth.

Moreover, in the conventional crystal growth apparatus having the foregoing structure, the evacuation or replacement of gases in the combustion tube is carried out at the lower end of the combustion tube. This makes the structure of the lower part of the tube complicated and correspondingly makes the assemblage thereof quite difficult. In the conventional crystal growth apparatus having the foregoing structure, the driving mechanism must be miniaturized and positioned in the proximity of the extension of the axis of the magnetic field applied and at a position in the close proximity to the water-cooled magnet (for instance, a position about 45 cm distant from the center of the magnetic field) in order to make effective use of the limited space under the water-cooled magnet. If a relatively strong magnetic field of, for instance, not less than 5 T (tesla) is applied to the apparatus having the foregoing structure, the motor as a driving source is affected by the magnetic field. This results in unstable rotation thereof and interferes with the stable rising and lowering of the combustion tube at a constant speed. For this reason, the magnitude of the magnetic field applied must be limited to a relatively low level on the order of not more than, for instance, 4 T.

SUMMARY OF THE INVENTION

The present invention has been developed to solve the foregoing problems associated with the conventional crystal growth apparatuses and accordingly, an object of the present invention is to provide a crystal growth apparatus which permits automatic alignment of the axis of the magnetic field established in the apparatus with the central axis of a combustion tube when arranging a vertical Bridgman furnace in a cylindrical vertical magnetic field space, for substantially easy alignment of these axes; in which a motor as a driving means is not adversely affected by the magnetic field established in the cylindrical and vertical magnetic field space even if it is increased to 10 T or higher; and which accordingly permits movement of the combustion tube at a stable constant speed.

The present invention thus relates to a crystal growth apparatus for growing a crystal by unidirectionally solidifying a melt, which comprises a vertical magnetic field-generating apparatus capable of establishing a cylindrical, vertical magnetic field space and a vertical Bridgman furnace arranged within the cylindrical, vertical magnetic field space, wherein it comprises the vertical magnetic field-generating apparatus; a base plate positioned above the vertical magnetic field-generating apparatus; a heat-generating furnace comprising a water jacket, a quartz tube and a heating element; a combustion tube for accommodating a crucible at a predetermined position; a means for vertically suspending and supporting the combustion tube; a means for guiding the suspending means to move it up and down; and a means for driving the suspending means in the upward and downward directions such that the combustion tube is lowered and risen in the heat-generating furnace; the guide means and the driving means being fitted to the base plate; the heat-generating furnace being arranged at a predetermined position within the cylindrical, vertical magnetic field space and fitted to the base plate through a supporting member; and a motor of the driving means being placed at a position wherein the motor is not greatly affected by the magnetic field established by the vertical magnetic field-generating apparatus.

Since the crystal growth apparatus according to the present invention has the structure as discussed above, in other words the relative positions of the foregoing base plate, heat-generating furnace, guide means and driving means are fixed and the movement of the combustion tube and the suspending means relative to these members and means is restricted, the relative positions of the vertical magnetic field-generating apparatus and the base plate can previously be defined and established by an appropriate guide means such as guide pins to thus automatically align the axis of the magnetic field with the central axis of the combustion tube. Moreover, the crystal growth apparatus according to the present invention simply requires the alignment of vertical magnetic field-generating apparatus with the base plate even if such a guide means is not used and does not require any operation for the installation of parts within a relatively narrow space under the water-cooled magnet unlike the conventional techniques in which these operations cannot be omitted. Thus, the apparatus of the invention makes the alignment of the axis of the magnetic field with the central axis of the combustion tube quite easy. In addition, the motor of the driving means is placed at a position sufficiently distant from the center of the magnetic field established by the vertical magnetic field-generating apparatus (for instance, a position about 30 cm distant from the extension of the axis of the magnetic field and about 90 cm distant from the center of the magnetic field) and this accordingly permits scaling up of the magnitude of a magnetic field established within the cylindrical vertical magnetic field space without taking into consideration any effect of the magnetic field on the motor.

BRIEF DESCRIPTION OF THE DRAWINGS

FIG. 4 is a plan view of the embodiment of the apparatus, taken along the line 4—4 in FIG. 2; and FIG. 5 is a plan view of the embodiment of the apparatus, taken along the line 5—5 in FIG. 2.

DESCRIPTION OF THE PREFERRED EMBODIMENTS

Figure 1:
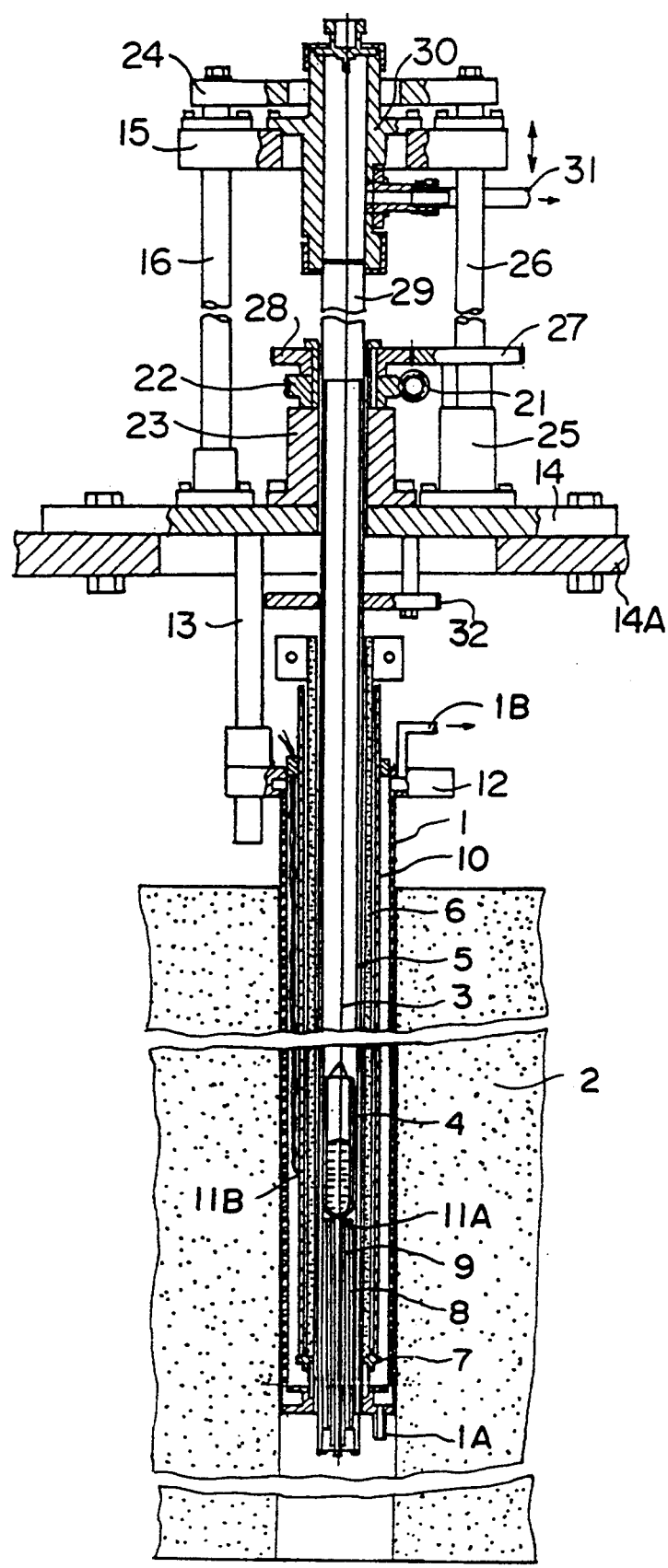
FIG. 1 is a longitudinal sectional view of an embodiment of the crystal growth apparatus according to the present invention.
Figure 2:
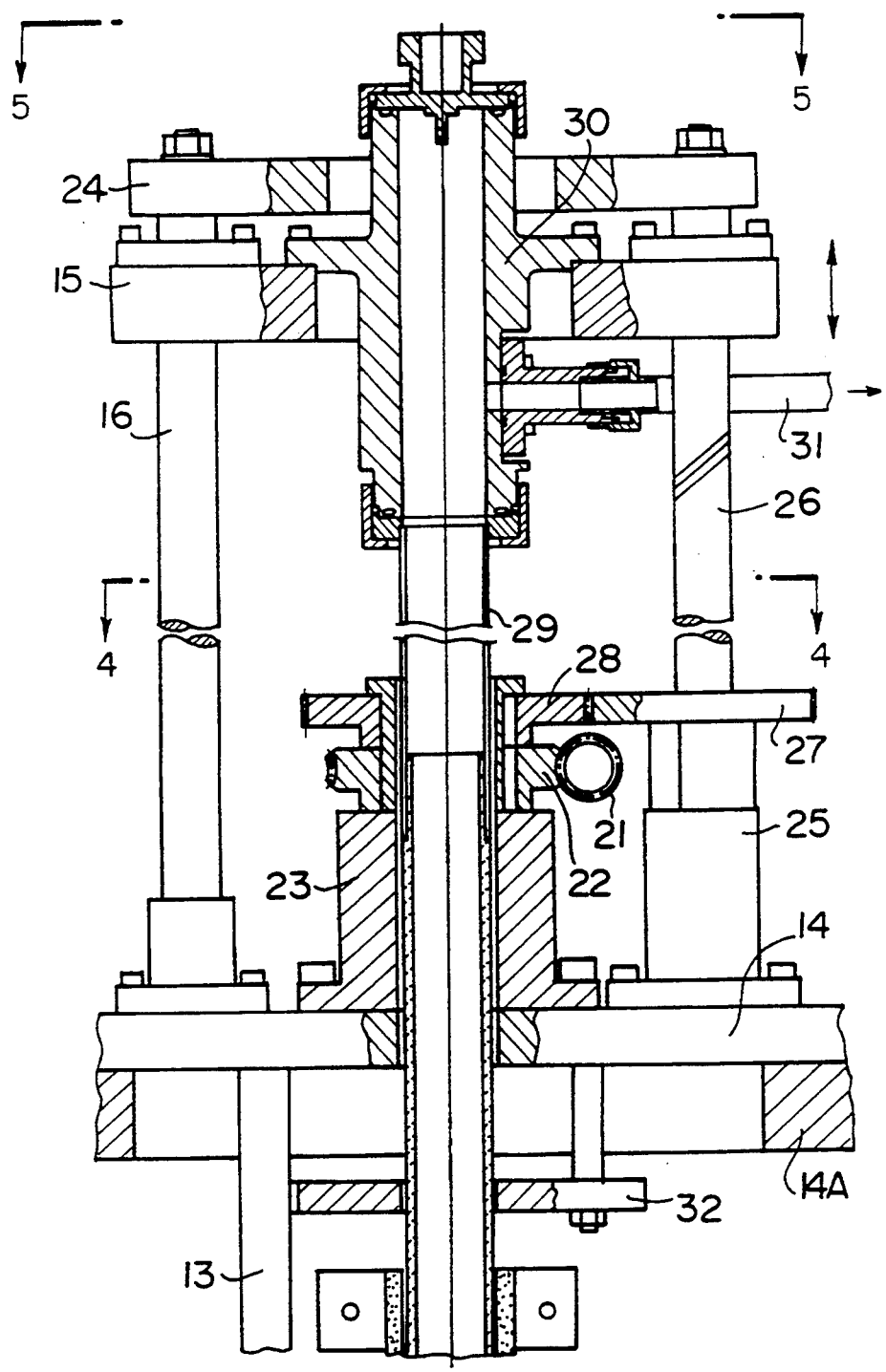
FIG. 2 is a longitudinal sectional view of the upper portion of the embodiment of the apparatus according to the present invention shown in FIG. 1.
Figure 3:
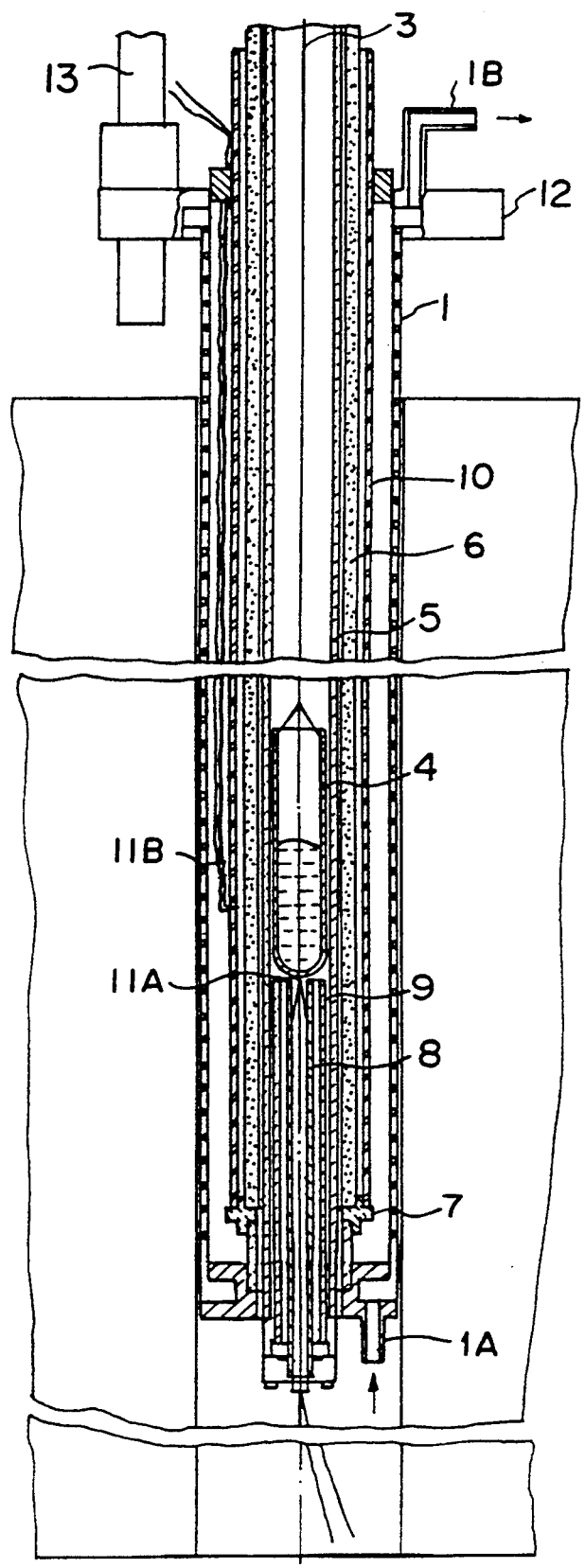
FIG. 3 is a longitudinal sectional view of the lower portion of the embodiment of the apparatus according to the present invention shown in FIG. 1.

An embodiment according to the present invention will hereinafter be described in detail with reference to the accompanying drawings. The attached figures illustrate the essential part of the crystal growth apparatus according to the present invention. In this embodiment, a cylindrical magnet 2 which is a vertical magnetic field-generating apparatus capable of establishing a cylindrical vertical magnetic field space is vertically arranged and a heat-generating furnace which comprises a water jacket 1, a quartz tube 10 and a heating element 6 is placed within a longitudinal hole (i,e., a cylindrical vertical magnetic field space) positioned at the center of the magnet 2 to thus form a longitudinal magnetic field space having a temperature gradient along the longitudinal axis of the magnet. The heat-generating furnace is automatically placed at a predetermined position in the cylindrical vertical magnetic field space by reducing the difference between the inner diameter of the longitudinal hole and the outer diameter of the heat-generating furnace (for instance, a clearance of 0.5 to 1 mm is left between the longitudinal hole and the heat-generating furnace) in such a manner that the heat-generating furnace can be inserted into the longitudinal hole and pulled out therefrom without any trouble. Thus, the axis of the magnetic field is automatically aligned with the cental axis of the heat-generating furnace and accordingly the central axis of a combustion tube is automatically aligned with the axis of the magnetic field as will be detailed below. For this reason, it is preferred to reduce the difference between the inner diameter of the longitudinal hole and the outer diameter of the heat-generating furnace as much as possible. Moreover, in the heat-generating furnace placed in the cylindrical vertical magnetic field space, there is arranged a combustion tube 5 which accommodates a crucible 4 suspended and supported by a suspending thread 3, supported by a crucible-supporting tube 8 and placed at a predetermined position within the combustion tube. The combustion tube 5 is lowered toward the center of the magnetic field together with the crucible 4 for the growth of an desired crystal according to the vertical Bridgman technique.

According to the crystal growth apparatus of the present invention, the combustion tube 5 is vertically suspended from the upper portion of the apparatus and arranged in such a manner that it can move up and down through the magnetic field space surrounded with the heat-generating furnace while the lower end of the tube 5 is in the free-end state. In this respect, the heat-generating furnace may be one conventionally used in a crystal growth apparatus which comprises a vertical Bridgman furnace incorporated into a cylindrical vertical magnetic field space or a furnace comprising the outermost water jacket 1, the quartz tube 10 and the innermost heating element 6 (for instance, a SiC heating element such as a Siliconit (trade name) silicon carbide electric heating element. The quartz tube 10 has an opening at the upper end thereof and the lower end thereof is fitted to the lower end of the water jacket 1 through an aluminum supporting member 7. A constant interstice is left between the upper end of the water jacket 1 and the quartz tube 10 by inserting a wedge therebetween, the heat-generating furnace 6 is placed in such a manner that the inner wall thereof can be vertically arranged and the combustion tube 5 is inserted in the heat-generating furnace 6 in such a manner that the tube can freely be lowered and risen. The combustion tube 5 is lowered and risen through the actions of the suspending means, the guide means and the driving means while ensuring the alignment of the central axis of the combustion tube with that of the heat-generating furnace and, in turn, the alignment of the axis of the magnetic field with the central axis of the combustion tube.

The crucible-supporting tube 8 is inserted into and fixed to the lower end of the combustion tube 5 to support the bottom of the crucible 4. Moreover, a thermocouple 11A is inserted in the supporting tube 8 through a protection tube 9 and extends from the lower end of the combustion tube 5 towads the bottom of the crucible 4 in order to detect the temperature of a melt contained in the crucible 4. In addition, a tip of a thermocouple 11B is fitted to the inner wall of the quartz tube 10 to detect the temperature of the heating element 6 and leading wires thereof is taken out through an upper opening positioned between the water jacket 1 and the quartz tube 10. A port 1A for water supply is formed on the lower edge of the water jacket 1 and a port 1B for water drainage is formed on the upper edge thereof so that cooling water can upwardly be passed therethrough. In this connection, a wire is accommodated in the water jacket 1 and spirally wound around the inner wall of the jacket to uniformize the flow of the cooling water.

The water jacket 1 is equipped with a supporting flange 12 on the upper end thereof. The supporting flange 12 is connected to a plurality of supporting rods 13 (only one rod is illustrated in the attached figure). The supporting rods 13 are suspended from a base plate 14 which is placed at the upper portion of the vertical magnetic field-generating apparatus and thus the heat-generating furnace is supported by a trestle 14A of the apparatus through the base plate 14.

The combustion tube 5 is suspended and supported through a cross-head 15 above the base plate 14 and a driving means for rising and lowering the combustion tube 5 (as will be detailed below) is fitted thereto through the cross-head 15. In this embodiment, a plurality of guide poles 16 (made from a material such as non-magnetic stainless steel) are vertically disposed on the base plate 14 so that the cross-head 15 can be upwardly and downwardly guided along these poles.

The driving means comprises a pair of motors 17, 17' which are placed on the right and left sides of the base plate 14 respectively and whose driving force is transmitted to the cross-head 15 through a power transmission system to rise and lower the cross-head 15. In this embodiment, the power transmission system is, more specifically, equipped with gears 19, 19' connected to power output shafts of the motors 17, 17' through clutches 18, 18', gears 20, 20' which are in mesh with these gears 19, 19', a worm 21 fitted to a shaft which is common to that for the gears 20, 20' and a worm wheel 22 which is in mesh with the worm 21. The worm wheel 22 is supported by a bearing 23 disposed on the base plate 14 so that the center of the rotation axis thereof coinsides with the center of the combustion tube 5. Thus, the driving force outputted from one of the motors 17, 17', for instance, the motor 17 can be transmitted to the gear 20 through the clutch 18 and the gear 19 to thus rotate the gear 20 for lowering the cross-head. In this case, the other motor 17' is in the standstill state and the clutch 18' is not in mesh with the gear. On the contrary, the driving force outputted from the other motor 17' can be transmitted to the gear 20' through the clutch 18' and the gear 19' to thus rotate (in the direction opposite to that of the gear 20) the gear 20' for rising the cross-head. In this case, the other motor 17 is in the standstill state and the clutch 18 is not in mesh width the gear.

The foregoing power transmission system is further provided with feed screw shafts 26, 26' which are parallel to the guide pole 16 and whose upper and lower ends are freely rotatably born by a support block 24 formed on the upper end of the guide pole 16 and a bearing 25 formed on the base plate 14 and the cross-head 15 is engaged with these feed screw shafts 26, 26'. Further spur gears 27, 27' are coaxially fitted to the feed screw shafts 26, 26' and these spur gears 27, 27' are in mesh with a spur gear 28 coaxially connected to worm wheel 22.

In the figures, the reference numeral 29 represents an adapter fitted to the upper end of the combustion tube 5, the adapter 29 is connected to a connecting head 30 and the connecting head 30 is fitted to the cross-head 15. In this embodiment, an exhaust port 31 is formed on the side of the connecting head 30 and the combustion tube 5 is connected to an appropriate vacuum evacuation system (not shown) through the exhaust port 31. In addition, the reference numeral 32 represents a heat-shielding plate.

The foregoing structure of the apparatus permits the rising and lowering of the cross-head 15 along the guide pole 16 by the action of the driving force outputted from either of the motors 17, 17' and transmitted to the cross-head 15 through the foregoing power transmission system and thus permits the rising and lowering of the crucible 4. Accordingly, a melt contained in the crucible 4 can be unidirectionally solidified by lowering the crucible 4 toward the center of the magnetic field to grow a desired crystal. Moreover, the lower end of the combustion tube 5 is in the free end state and this eliminates the requirements for the dismantlement and assemblage of the lower part of the combustion tube and the driving means and for the alignment of the axis of the magnetic field with the central axis of the combustion tube unlike the conventional apparatuses. Moreover, the driving means for the combustion tube is positioned at the upper portion in the magnetic field space as described above and thus there is not any dead space. Further the driving means is placed at a position sufficiently distant from the center of the magnetic field and therefore, the motors are not adversely affected by the magnetic field even if the magnitude of the magnetic field is increased. Thus, stable rotational speeds of these motors can be ensured. For instance, any inconvenience such as unstable lowering speed of the the combustion tube does not occur even in a process which requires 8 hours or longer for growing a crystal. In the conventional apparatuses, the driving means is, in fact, placed at a position only about 45 cm distant from the center of the magnetic field to be established and accordingly, the motor is greatly affected by the magnetic field and the rotational speed thereof becomes unstable when the magnitude of the magnetic field is increased up to 5 T or higher. To solve this problem, the magnitude of the magnetic field applied is limited to not more than 4 T in the conventional apparatuses. On the other hand, according to the apparatus of the present invention having the foregoing structure, the driving means is placed at a position about 90 cm distant from the center of the magnetic field and the foregoing problem does not arise even if the magnitude of the magnetic field is increased to 10 T or higher.

Incidentally, the temperature of the melt contained in the crucible 4 under the influence of such a strong magnetic field can be completely controlled by adjusting the temperature of the heating element 6 through a thyristor regulator on the basis of the information outputted from the thermocouple 11A and 11B.

Since the crystal growth apparatus according to the present invention has a structure detailed above, it is not necessary to align the axis of the magnetic field with the central axis of the combustion tube and the inner wall of the heat-generating furnace does not come in contact with the combustion tube. This eliminates any possibility of agitation of the melt due to vibration and results in optimum crystal growth. Moreover, the motor of the driving means is arranged at a position which is not affected by the magnetic field established by the vertical magnetic field-generating apparatus and, therefore, the restriction on the magnitude of the magnetic field applied is greatly relaxed.

We claim:

1. A crystal growth apparatus for growing a crystal by unidirectionally solidifying a melt, comprising:
 a vertical magnetic field-generating apparatus capable of establishing a cylindrical, vertical magnetic field space;
 a vertical Bridgman furnace arranged within the cylindrical, vertical magnetic field space;
 a base plate positioned above the vertical magnetic field-generating apparatus;
 a heat-generating furnace comprising a water jacket, a quartz tube and a heating element, the heat-generating furnace being arranged at a predetermined position within the cylindrical, vertical magnetic field space and fitted to the base plate through a supporting member;
 a combustion-tube for accommodating a crucible at a predetermined position;
 a suspending structure for vertically suspending and supporting the combustion tube;
 a driving structure for driving the suspending structure upward and downward in order to raise and lower the combustion tube within the heat-generating furnace,
 the driving structure comprising a motor placed at a position such that the motor is not greatly affected by the magnetic field established by the vertical magnetic field-generating apparatus; and
 a guiding structure for guiding the suspending structure during raising and lowering of the combustion tube,
 the guiding structure and the driving structure being fitted to the base plate.

* * * * *